(12) United States Patent
Kalavade et al.

(10) Patent No.: US 10,599,515 B2
(45) Date of Patent: Mar. 24, 2020

(54) TRANSFER OF ENCODED DATA STORED IN NON-VOLATILE MEMORY FOR DECODING BY A CONTROLLER OF A MEMORY DEVICE

(71) Applicant: INTEL CORPORATION, Santa Clara, CA (US)

(72) Inventors: Pranav Kalavade, San Jose, CA (US); Ravi H. Motwani, Fremont, CA (US)

(73) Assignee: INTEL CORPORATION, Santa Clara, CA (US)

( * ) Notice: Subject to any disclaimer, the term of this patent is extended or adjusted under 35 U.S.C. 154(b) by 85 days.

(21) Appl. No.: 15/851,596

(22) Filed: Dec. 21, 2017

(65) Prior Publication Data

US 2019/0034269 A1   Jan. 31, 2019

(51) Int. Cl.
*G06F 11/10* (2006.01)
*H03M 13/11* (2006.01)
*G11C 29/52* (2006.01)
*G11C 29/04* (2006.01)

(52) U.S. Cl.
CPC .......... *G06F 11/1068* (2013.01); *G11C 29/52* (2013.01); *H03M 13/1105* (2013.01); *H03M 13/1128* (2013.01); *H03M 13/1148* (2013.01); *G11C 2029/0409* (2013.01)

(58) Field of Classification Search
CPC .......... H03M 13/1111; H03M 13/1105; H03M 13/1148; H03M 13/1128; G06F 11/10; G06F 11/1068; G06F 11/1072
See application file for complete search history.

(56) References Cited

U.S. PATENT DOCUMENTS

| 9,009,576 B1* | 4/2015 | Jeon .................... H03M 13/1111 714/773 |
| 9,535,777 B2 | 1/2017 | Kalavade et al. |
| 2013/0007561 A1 | 1/2013 | Motwani |
| 2014/0071761 A1 | 3/2014 | Sharon et al. |
| 2015/0188577 A1* | 7/2015 | Ogawa .................... G06F 11/10 714/759 |
| 2016/0283320 A1 | 9/2016 | Motwani et al. |

OTHER PUBLICATIONS

Micron, "NAND Flash Memory", © 2004 Micron Technology, Inc., 57 pp.
Motwani, R., et al., "Low Density Parity Check (LDPC) Codes and the Need for Stronger ECC", Aug. 2011, 18 pp.

* cited by examiner

*Primary Examiner* — Shelly A Chase
(74) *Attorney, Agent, or Firm* — Konrad Raynes Davda & Victor LLP; Rabindranath Dutta (57) ABSTRACT

A non-volatile memory unit receives a request from a controller to read encoded data stored in a non-volatile memory of the non-volatile memory unit. In response to determining by logic included in the non-volatile memory unit that the controller is estimated to be able to successfully decode the encoded data more than a predetermined percentage of times, the encoded data is transferred from the non-volatile memory unit to the controller.

20 Claims, 7 Drawing Sheets

TRANSFER OF ENCODED DATA STORED IN NON-VOLATILE MEMORY FOR DECODING BY A CONTROLLER OF A MEMORY DEVICE

BACKGROUND

A solid state drive (SSD) is a data storage device that uses integrated circuit assemblies as memory to store data persistently. SSDs have no moving mechanical components and this distinguishes SSDs from traditional electromechanical magnetic disks, such as, hard disk drives (HDDs) or floppy disks, which contain spinning disks and movable read/write heads. Compared to electromechanical disks, SSDs are typically more resistant to physical shock, run silently, have lower access time, and have less latency. Many types of SSDs use NAND-based flash memory which comprises an electronic (solid-state) non-volatile computer storage medium that can be electrically erased and reprogrammed.

NAND-based flash memory may have bit errors in stored data. To allow recovery from such bit errors, data may be stored in an encoded form in NAND-based flash memory, by using an error correction code (ECC) to encode the data. Error correction techniques may be employed on the encoded data to remove the errors and reconstruct the original data.

BRIEF DESCRIPTION OF THE DRAWINGS

Referring now to the drawings in which like reference numbers represent corresponding parts throughout.

DETAILED DESCRIPTION

In the following description, reference is made to the accompanying drawings which form a part hereof and which illustrate several embodiments. It is understood that other embodiments may be utilized and structural and operational changes may be made.

SSDs are reliable but are not error-free and may rely on error correction codes (ECC) to allow correction of bit errors in the data stored in NAND-based flash memories. One commonly used error correction code used in SSDs is the low density parity check (LDPC) code. Data encoded via an LDPC code is referred to as LDPC encoded data, where the LDPC encoded data may also be referred to as a codeword. The NAND-based flash memories of a SSD may store LDPC encoded data.

A set of reference voltages may be used by a controller of a SSD to read the LDPC encoded data from the NAND-based flash memory. A decoder in the controller may decode the LPDC encoded data. Many types of decoders for LDPC encoded data, such as, min-sum decoders, bit flipping decoders, etc., are in use for decoding LDPC encoded data. The errors in data encoded via LDPC may be removed by decoding the LDPC encoded data.

Syndrome decoding is a mechanism that is used in the decoding of LDPC encoded data. From the syndrome weight determined during syndrome decoding, it is possible to determine the likelihood of successful LDPC decoding of the data. Successful LDPC decoding of data means that the original data is recovered by decoding the LDPC encoded data that has bit errors. If errors exceed a certain threshold then the LDPC decoding will fail, i.e., the LDPC decode process is unable to correct for the bit errors in LDPC encoded data.

In certain mechanisms, a read operation from the NAND memory may be comprised of first performing a hard bit read (HBR) from the controller on the LDPC encoded data stored in the NAND memory. In HBR, the LDPC encoded data is read from the NAND memory as so-called "hard data" (i.e., the logical high and low bit levels in the LDPC encoded data are taken as a "1" and "0", respectively). The HBR is performed at a first reference voltage. Different reference voltages used for reading may lead to different amounts on errors in the data read from the NAND memory. If LDPC decode fails at the controller on the retrieved LDPC encoded data, then another read reference voltage [referred to as a moving read reference (MRR)] for another HBR may be attempted by the controller to read the LDPC encoded data once again. If the read operation based on the MRR fails, then a soft bit read (SBR) is attempted by the controller. In SBR, the LDPC encoded data is read from the NAND memory as so-called "soft data" (i.e., the logical high and low bit levels in the LDPC encoded data are taken as "1" and "0", respectively, and probability information is provided indicating the likelihood that a respective bit in the LDPC encoded data is a "1" or "0"). Multiple reads are performed during the SBR. The likelihood of success (i.e., retrieving the original data from the LDPC encoded data) is higher in SBR than in HBR.

Multiple reads from the NAND memory may lead to a degradation of the quality of service (QoS) as the LDPC encoded data has to be transferred multiple times from the NAND memory to the controller. The effect of performing this multi stage attempt at LDPC decoding is that the latency of each of the stages become additive and impacts the overall latency of the LDPC decoding. Certain embodiments provide mechanisms to transfer data from the NAND memory to the controller only if the likelihood of LDPC decode success in the controller is high enough. Logic within the NAND determines whether or not to transfer the LDPC encoded data to the controller, based on the syndrome computed by the logic, where the syndrome weight determined while computing the syndrome provides an estimate of the likelihood of LDPC decode success in the controller. This results in a potential quality of service improvement for the SSD.

Figure 1:
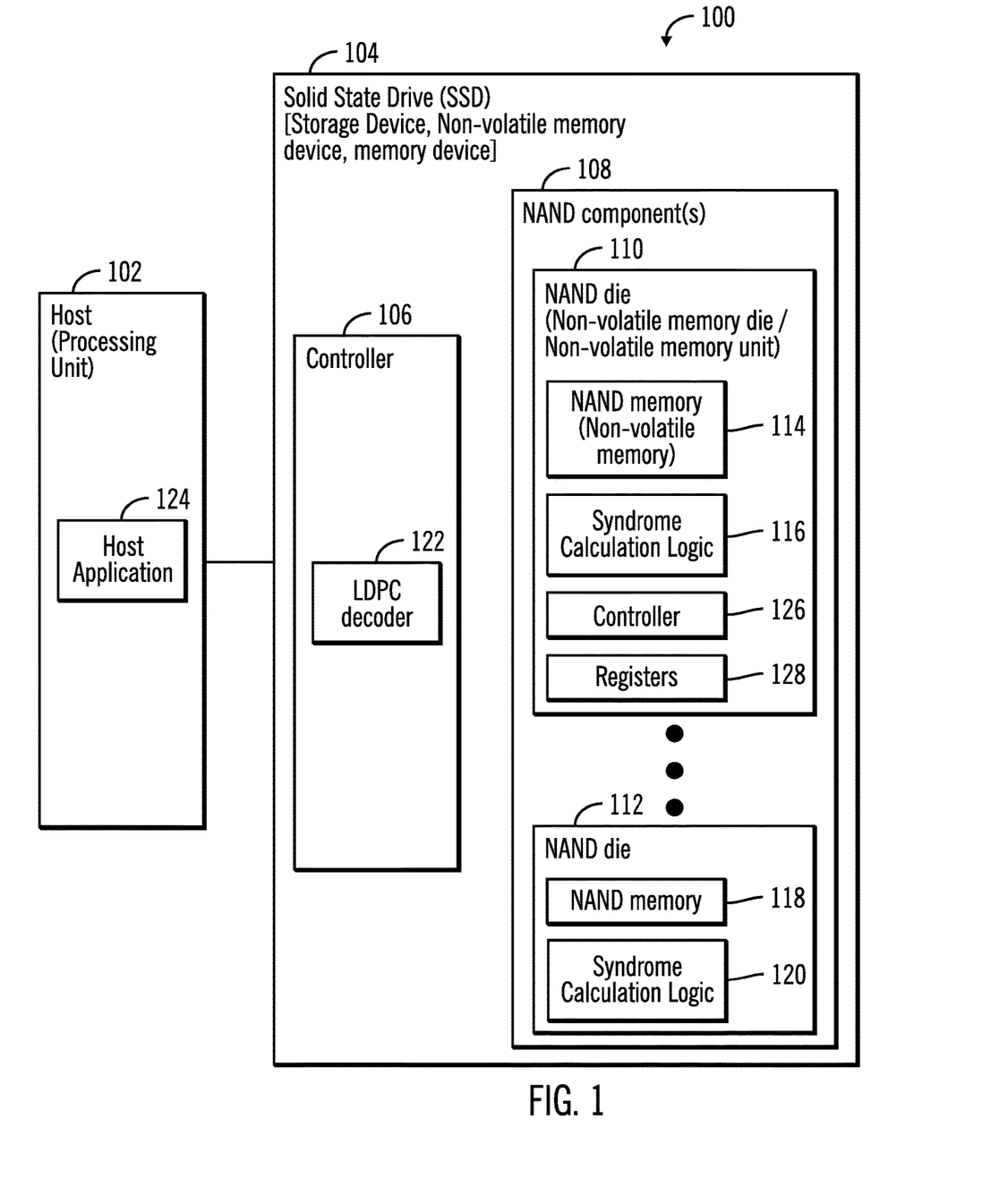
FIG. 1 illustrates a block diagram of a computing environment in which a host is coupled to a SSD comprised of NAND memory, in accordance with certain embodiments.

FIG. 1 illustrates a block diagram of a computing environment 100 in which a host 102 is coupled to a storage device, such as a SSD 104, in accordance with certain embodiments. In certain embodiments the SSD 104 may be comprised of a controller 106 and NAND components 108. The NAND components 108 may be comprised of a plurality of NAND dies 110, 112. In certain alternative embodiments, the storage device 104 may include a secure digital card, a multimedia card, a flash drive (for example, a Universal Serial Bus (USB) flash drive also known as a "USB thumb drive" or "USB memory stick" that includes non-volatile memory with an integrated USB interface), and other types of non-volatile storage device.

In certain embodiments, each of the NAND dies 110, 112 may be comprised of NAND memory, and a syndrome calculation logic implemented in hardware, firmware, software or any combination thereof. In certain embodiments, the syndrome calculation logic may be implemented in Application Specific Integrated Circuit (ASIC) in the NAND dies 110, 112. In other embodiments, instructions for the syndrome calculation logic may be executed by a processor included in the NAND dies 110, 112. For example the NAND die 110 may be comprised of NAND memory 114 and a syndrome calculation logic 116, and the NAND die 112 may be comprised of NAND memory 118 and a syndrome calculation logic 120. The syndrome calculation logic may calculate the syndrome for LDPC encoded data. In certain embodiments the NAND memory 112, 118 may comprise a single-level cell (SLC) NAND, a multi-level cell (MLC) NAND, a triple-level cell (TLC) NAND, a quad-level cell (QLC) NAND or any other type of NAND or any other type of non-volatile memory. In other embodiments, the SSD 104 may be comprised of a controller 106 that controls certain other types of non-volatile memory, such as NOR memory or some other suitable non-volatile memory. Non-volatile memory is a storage medium that does not require power to maintain the state of data stored by the storage medium. Nonlimiting examples of nonvolatile memory may include any or a combination of: solid state memory [such as planar or three Dimensional (3D) NAND flash memory or NOR flash memory], 3D crosspoint memory, storage devices that use chalcogenide phase change material (e.g., chalcogenide glass), byte addressable nonvolatile memory devices, multi-threshold level NAND flash memory, ferroelectric memory, silicon-oxide-nitride-oxide-silicon (SONOS) memory, polymer memory (e.g., ferroelectric polymer memory), ferroelectric transistor random access memory (Fe-TRAM) ovonic memory, nanowire memory, electrically erasable programmable read-only memory (EEPROM), other various types of non-volatile random access memories (RAMs), magnetic storage memory, single or multi-level Phase Change Memory (PCM), a resistive memory, nanowire memory, anti-ferroelectric memory, magnetoresistive random access memory (MRAM) memory that incorporates memristor technology, resistive memory including the metal oxide base, the oxygen vacancy base and the conductive bridge Random Access Memory (CB-RAM), or spin transfer torque (STT)-MRAM, a spintronic magnetic junction memory based device, a magnetic tunneling junction (MTJ) based device, a DW (Domain Wall) and SOT (Spin Orbit Transfer) based device, a thiristor based memory device. In some embodiments, 3D crosspoint memory may comprise a transistor-less stackable cross point architecture in which memory cells sit at the intersection of word lines and bit lines and are individually addressable and in which bit storage is based on a change in bulk resistance. A memory device may refer to the die itself and/or to a packaged memory product. In certain embodiments, a memory module with non-volatile memory may comply with one or more standards promulgated by the Joint Electron Device Engineering Council (JEDEC), such as JESD218, JESD219, JESD220-1, JESD223B, JESD223-1, or other suitable standard (the JEDEC standards cited herein are available at www.jedec.org). In certain embodiments, the SSD 104 may be capable of storing several terabytes of data or more.

In certain embodiments, the controller 106 of the SSD 104 may include a LDPC decoder 122, where the LDPC decoder 122 is implemented in hardware, firmware, software, or any combination thereof. The LDPC decoder 122 may perform a LDPC decoding of LDPC encoded data received from the NAND dies 110, 112.

In certain embodiments each of the NAND dies 110, 112 may include a controller and registers that may be used for implementation of the syndrome calculation logic 116. For example, NAND die 110 is shown to have a controller 126 and registers 128.

In certain embodiments, the host 102 (also referred to as a processing unit) may be comprised of any suitable computational device, such as a personal computer, a mainframe, a telephony device, a smart phone, a storage controller, a blade computer, a processor with memory, etc. In certain embodiments, the host 102 may communicate with the SSD 104 over a bus (such as a Peripheral Component Interconnect (PCIe), Serial Advanced Technology Attachment (SATA), Serial Attached Small Computer System Interface (SAS)) or a network, such as the Internet, a storage area network (SAN), a local area network (LAN). In certain embodiments, the host 102 may communicate with the SSD 104 via a Non-Volatile Memory Express (NVMe) interface (http://www.nvmexpress.org). In certain embodiments, a host application 124 that is implemented in software, firmware, hardware, or any combination thereof may execute in the host 102.

Figure 2:
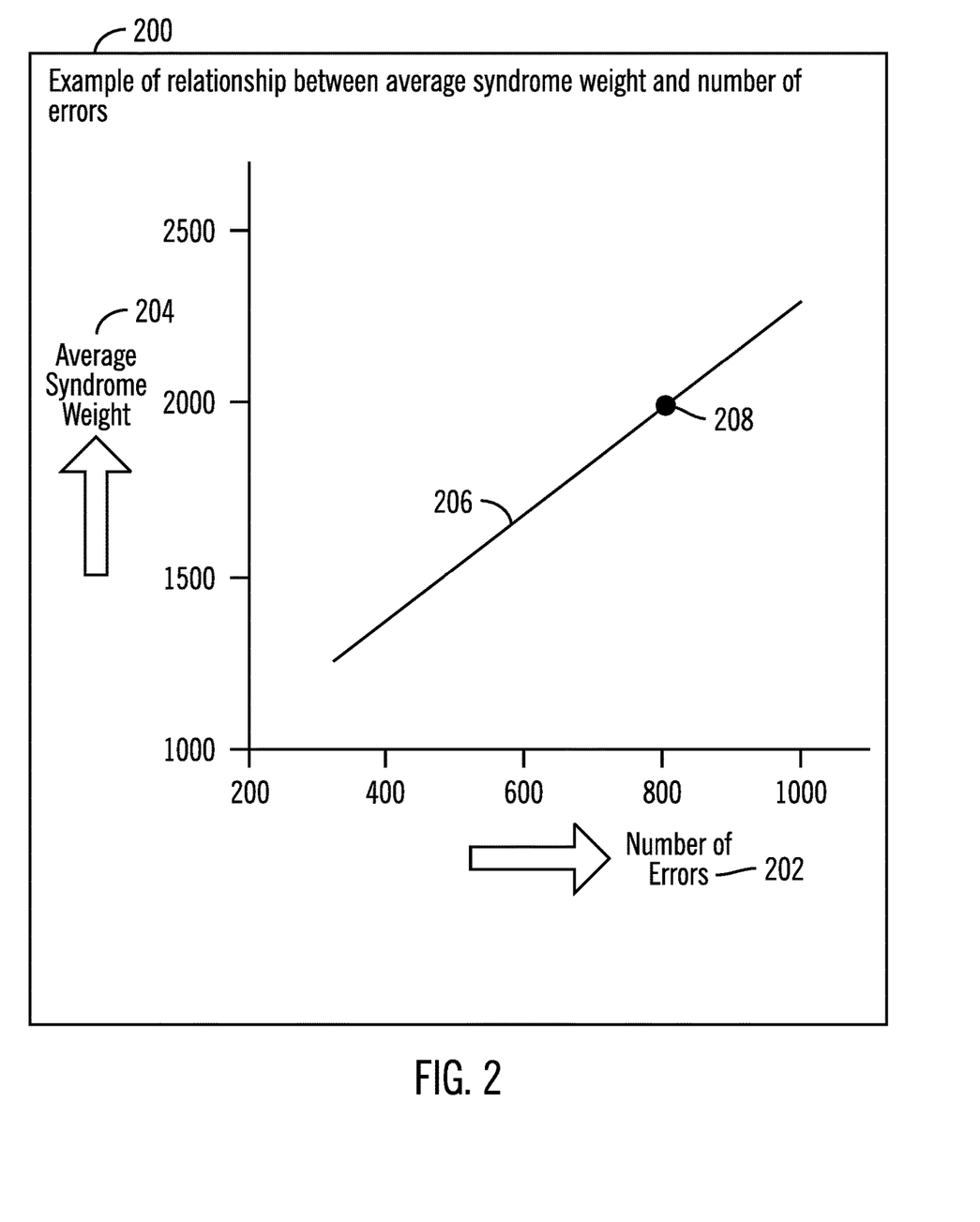
FIG. 2 illustrates a block diagram that shows an example of a relationship between average syndrome weight and number of errors, in accordance with certain embodiments.

FIG. 2 illustrates a block diagram 200 that shows an example of a relationship between average syndrome weight and number of errors, in accordance with certain embodiments. In the process of decoding an LDPC encoded data, a calculation of syndrome is performed. During the process of calculation of syndrome, the syndrome weight is determined.

In FIG. 2, the horizontal axis shows the number of errors 202 and the vertical axis shows the average syndrome weight 204. Line 206 shows that as the average syndrome weight increases the number of errors during LDPC decoding increases. From the plot of line 206 the number of errors corresponding to a calculated syndrome weight can be determined. For example, if the syndrome weight is calculated to be 2000 then 800 errors are found (as shown via reference numeral 208).

Figure 3:
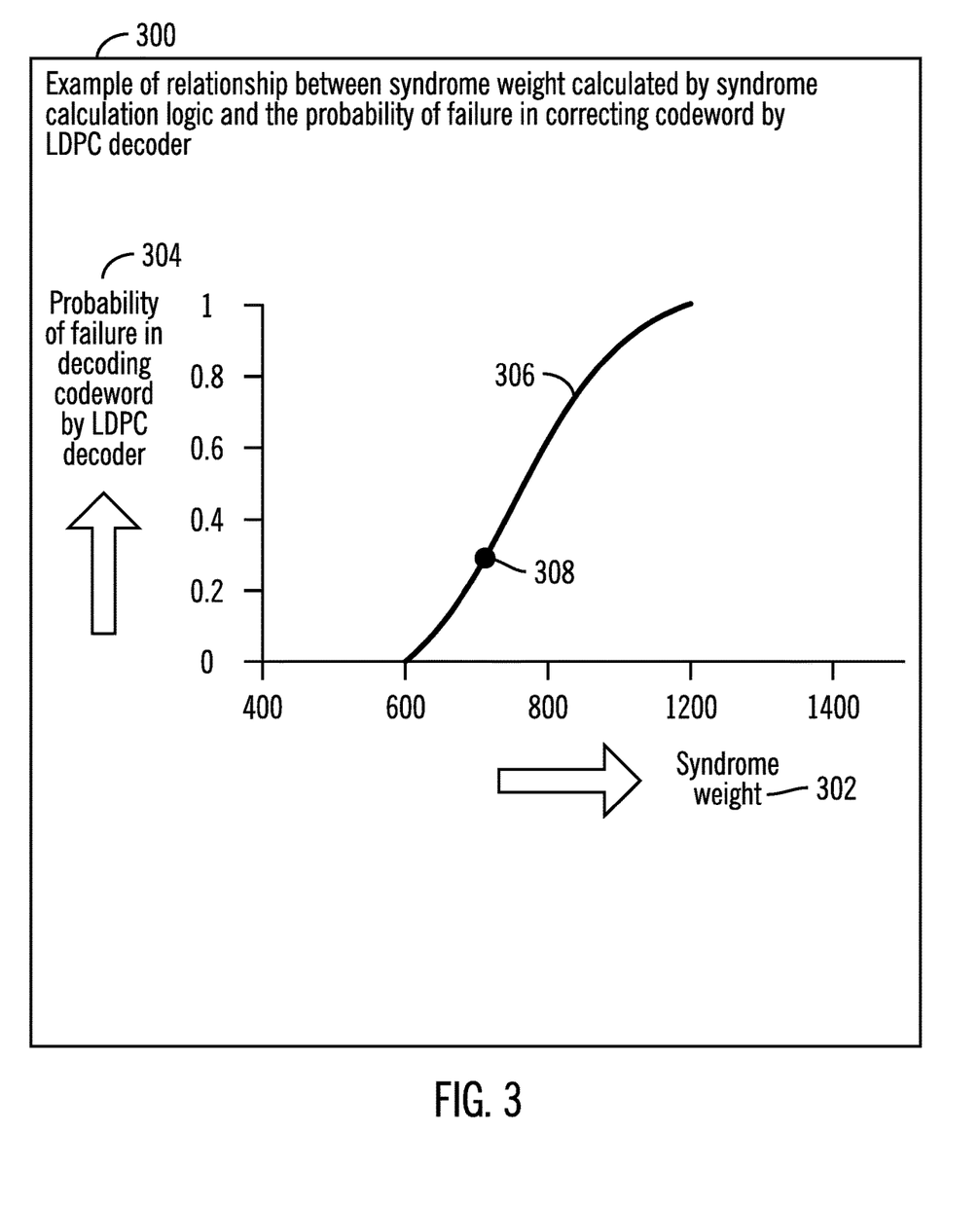
FIG. 3 illustrates a block diagram that shows an example of a relationship between syndrome weight calculated by a syndrome calculation logic and the probability of failure in correcting a codeword by a low density parity check (LDPC) decoder, in accordance with certain embodiments.

FIG. 3 illustrates a block diagram 300 that shows an example of a relationship between syndrome weight calculated by a syndrome calculation logic and the probability of failure in correcting codeword by a LDPC decoder, in accordance with certain embodiments.

In FIG. 3, the horizontal axis shows the syndrome weight 302 and the vertical axis shows the probability of failure 304 in decoding a codeword (i.e., a LDPC encoded data) by a LDPC decoder. From plot 306, it may be seen that as the syndrome weight becomes close to 1200 it is almost certain that an LDPC decoder will not be able to decode the codeword, and as the syndrome weight becomes close to 600 it is almost certain that an LDPC decoder will be able to decode the codeword. From plot 306 it can also be see that if the syndrome weight is 700 then the probability of failure in LDPC decode is 0.3 (as shown via reference numeral 308).

Figure 4:
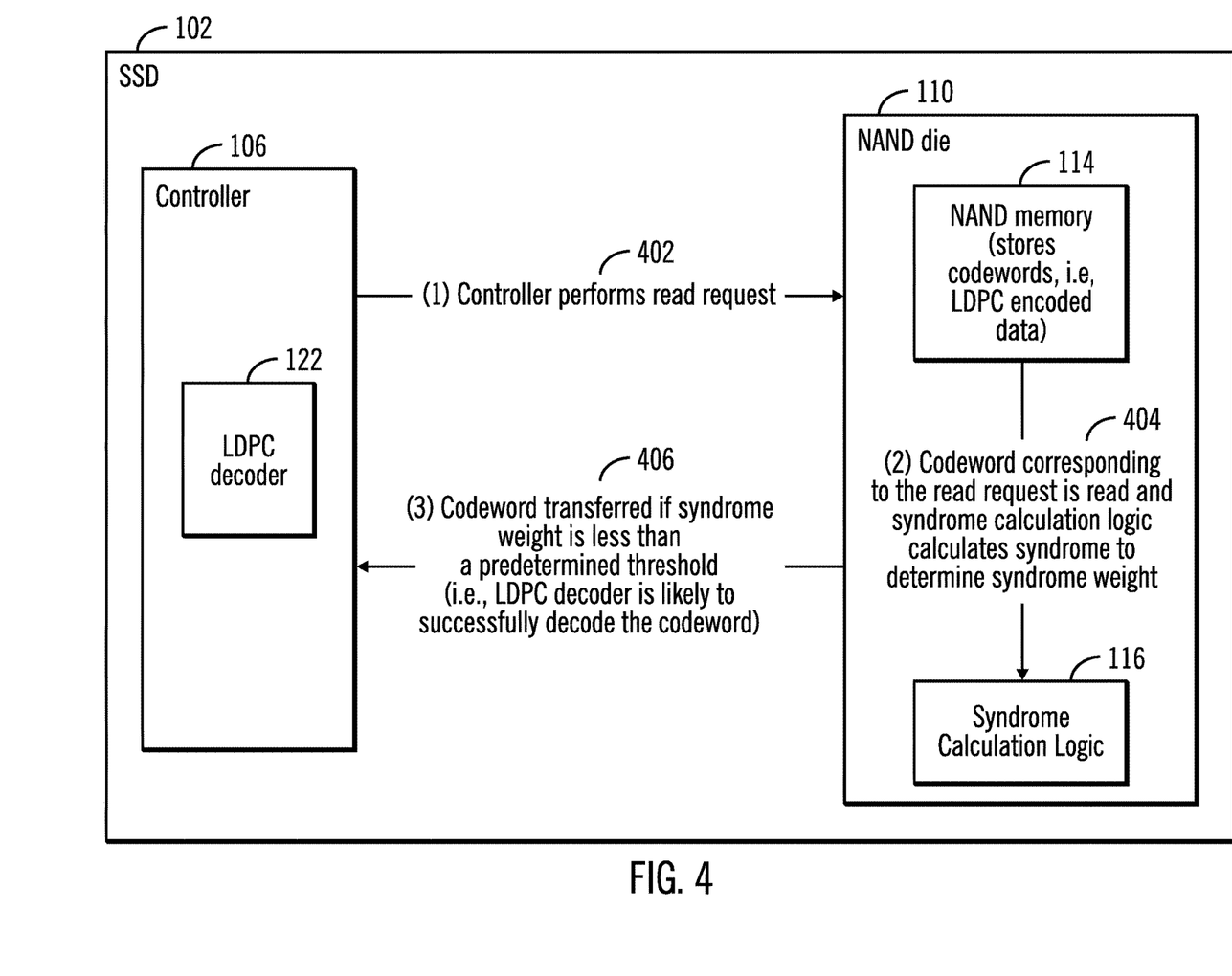
FIG. 4 illustrates a block diagram that shows operations performed in a SSD in which a syndrome calculation logic is included in a NAND die that includes NAND memory, and a LDPC decoder is included in a controller that is external to the NAND die, in accordance with certain embodiments.

FIG. 4 illustrates a block diagram that shows operations performed in the SSD 104 in which the syndrome calculation logic 116 is included in the NAND die 110 that includes the NAND memory 114, and in which the LDPC decoder 122 is included in the controller 106 of the SSD 104, in accordance with certain embodiments.

In certain embodiments, the controller 106 transfers a read request to the NAND die 110 (as shown via reference numeral 402). The NAND memory 114 of the NAND die 110 stores LDPC encoded data, where the LDPC encoded data is referred to as codewords in ECC terminology.

The codeword corresponding the read request received from the controller 106 is read from the NAND memory 114 within the NAND die 110, and the syndrome calculation logic 116 included within the NAND die 110 calculates the syndrome for the codeword to determine the syndrome weight (as shown via reference numeral 404).

The LDPC decoder 122 included in the controller 106 may also include components analogous to the syndrome calculation logic 116 for LDPC decoding. However, the components analogous to the syndrome calculation logic 116 that may be present in the LDPC decoder 122 included in the controller 106 are used for LDPC decoding a fewer number of times as fewer LDPC decodes need to be performed in the controller 106 because the NAND die 110 transfers the codeword to the controller 106 if the syndrome weight is less than a predetermined threshold (as shown via reference numeral 406). For example, based on the example shown in FIG. 3 if the predetermined threshold is set to be 600, then it is virtually certain (because the probability of failure shown for syndrome weight 600 is 0) that the codeword will be successfully decoded by the LDPC decoder 122 in the controller 106. If the predetermined threshold is set to be 700, then about 70% of the times the codeword will be successfully decoded by the LDPC decoder 122 in the controller 106. This is because the probability of failure shown for syndrome weight 700 is 0.3 in FIG. 3 (shown via reference numeral 308).

The predetermined threshold may be programmed based on performance requirements of the SSD 104 that includes the controller 106 and the non-volatile memory dies 110, 112. If a certain level of latency has to be maintained, then the predetermined threshold may be adjusted to achieve the desired level of latency.

Therefore, instead of transferring the codeword in response to every request from the controller 106, the NAND die 110 transfers the codeword to the controller 106 only if the likelihood of decoding the transferred codeword in the controller is "high enough". For example, if decoding successfully 70% of the times is "high enough", then the NAND die 110 transfers the codeword to the controller 106 if the syndrome calculation logic 116 calculates the syndrome weight corresponding to the codeword to be 700 or less (in accordance with the example shown in FIG. 3).

As a result, unless the LDPC decoder 122 of the controller is likely to be able to decode a codeword, the NAND die 110 does not transfer the codeword to the controller 106, in response to a read request from the controller 106. The quality of service is improved over mechanisms in which no such determination is made, because the controller 106 has to send a request for reading the codeword a fewer number of times to the NAND die 110, and the codeword is transferred to the controller 106 only if the controller 106 is likely to be able to decode the codeword.

Figure 5:
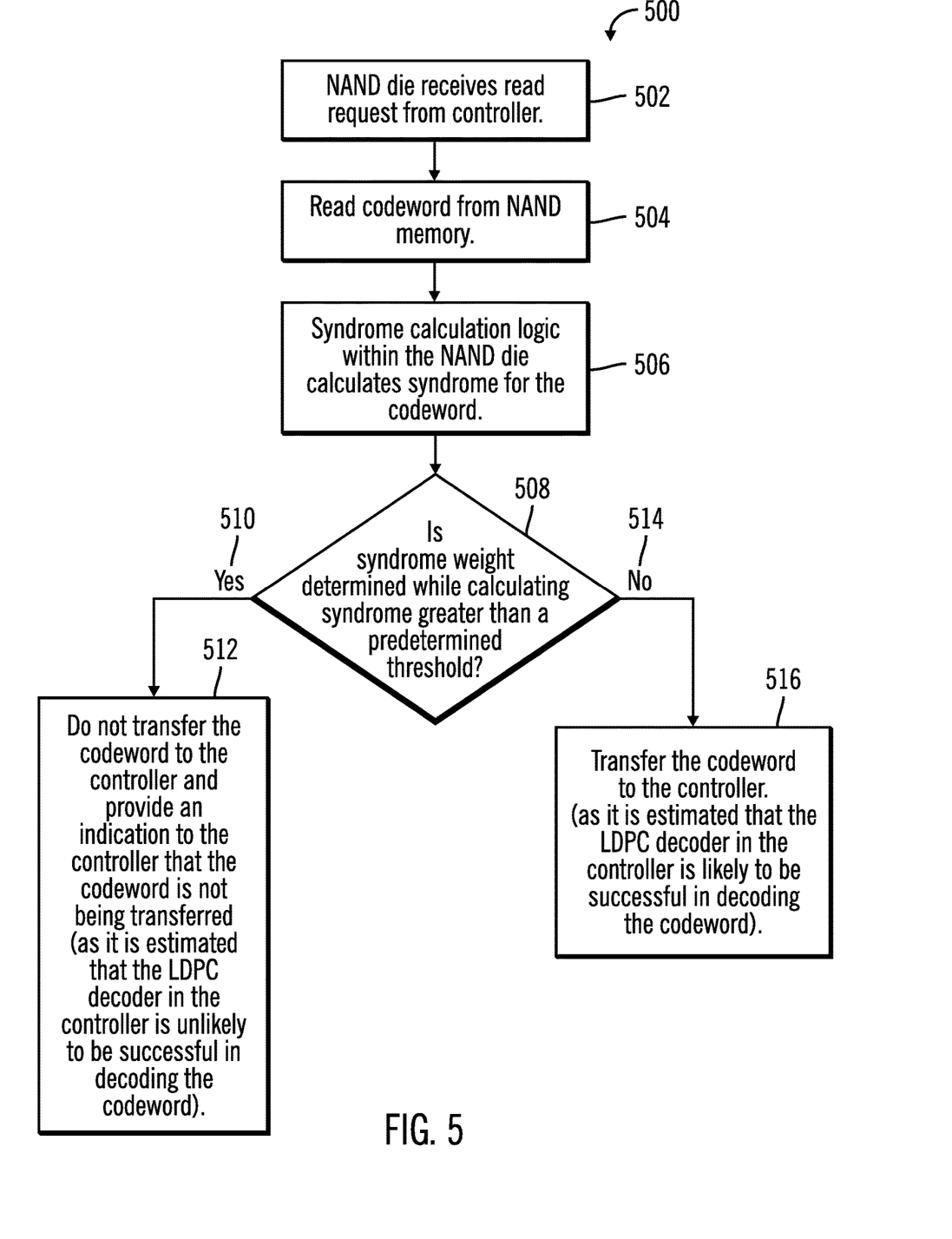
FIG. 5 illustrates a first flowchart that shows operations for transmission of encoded data stored in a non-volatile memory for decoding by a controller of a memory device, in accordance with certain embodiments.

FIG. 5 illustrates a first flowchart 500 that shows operations for transmission of encoded data stored in non-volatile memory 114 for decoding by a controller 106 of a memory device 104, in accordance with certain embodiments. The operations shown in FIG. 5 may be performed in the NAND die 110 of the memory device 104.

Control starts at block 502 in which the NAND die 110 receives a read request from the controller 106 of the memory device 104. Logic in the NAND die 110 reads (at block 504) the codeword (i.e., LDPC encoded data) corresponding to the read request, from the NAND memory 114. Control proceeds to block 506 in which the syndrome calculation logic 116 within the NAND die 110 calculates the syndrome for the codeword. In certain embodiments, the syndrome calculation logic 116 may be implemented in software, firmware, or hardware on any combination thereof in the NAND die 110. In certain embodiments, circuitry, ASIC, processor, firmware, executable instructions, etc., that may be present in the NAND die 110 may be used to implement the syndrome calculation logic 116.

The syndrome calculation logic 116 in the NAND die 110 determines (at block 508) whether the syndrome weight determined while calculating the syndrome is greater than a predetermined threshold. If so ("Yes" branch 510) control proceeds to block 512 in which the NAND die 110 does not transfer the codeword to the controller 106 because the NAND die 110 has estimated that the LDPC decoder 122 in the controller is unlikely to be "successful" in decoding the codeword, where being "successful" means that that errors found during the LDPC decoding are few enough to recover the data from the codeword. In block 512 instead of transferring the codeword to the controller, the NAND die 110 provides an indication to indicate to the controller 106 that the codeword will not be transferred.

If at block 508 the syndrome calculation logic 116 in the NAND die 110 determines that the syndrome weight determined while calculating the syndrome is not greater than a predetermined threshold ("No" branch 514) control proceeds to block 516 in which the NAND die 110 transfers the codeword to the controller 106 because the NAND die 110 has estimated that the LDPC decoder 122 in the controller 106 is likely to be "successful" in decoding the codeword.

Figure 6:
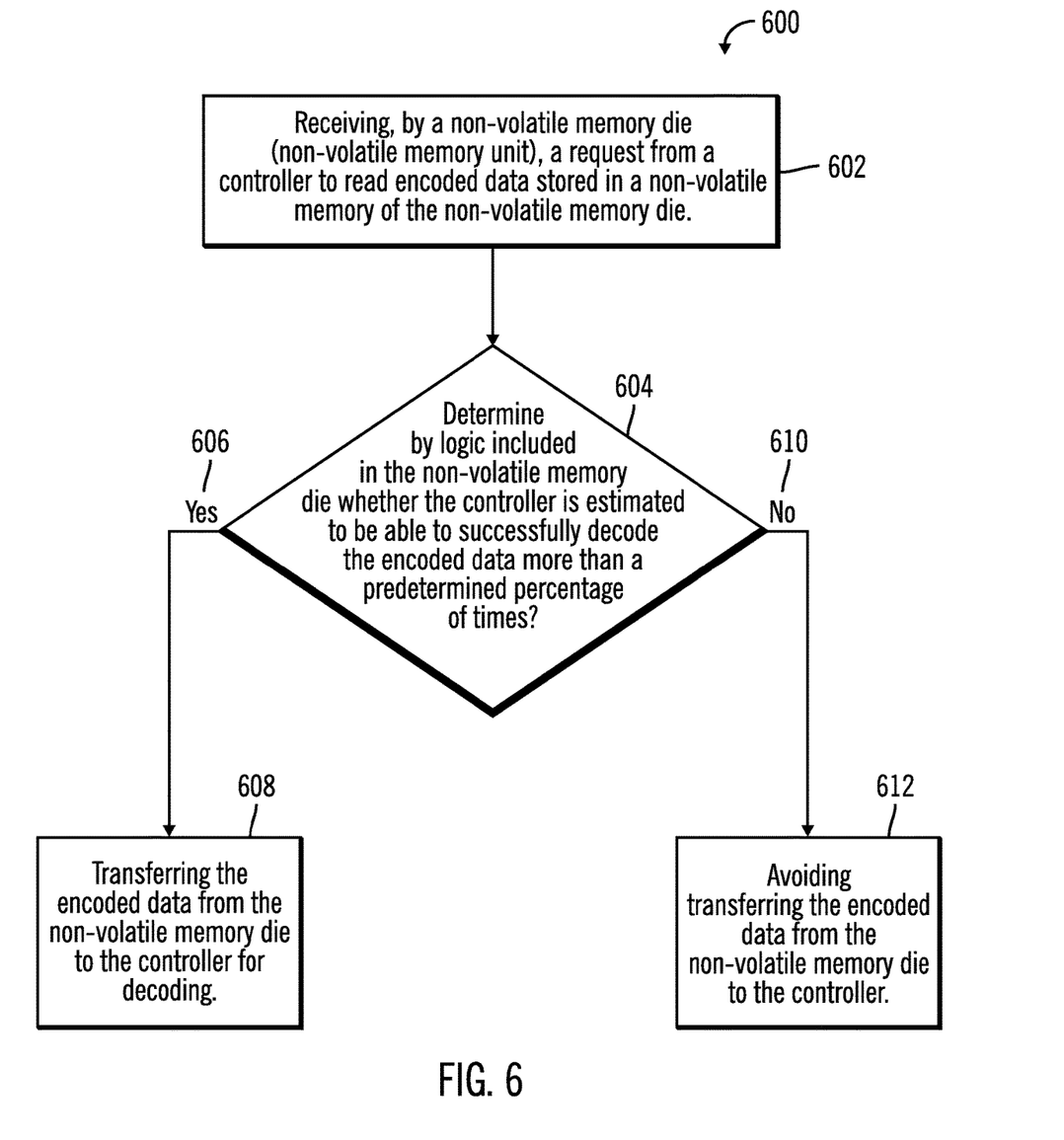
FIG. 6 illustrates a second flowchart that shows operations for transmission of encoded data stored in a non-volatile memory for decoding by a controller of a memory device, in accordance with certain embodiments.

FIG. 6 illustrates a second flowchart 600 that shows operations for transmission of encoded data stored in non-volatile memory 114 for decoding by a controller 106 of a memory device 104, in accordance with certain embodiments. The operations shown in FIG. 6 may be performed in the NAND die 110 of the memory device 104. For example, a controller 126 within the NAND die 110 may perform operations shown in the second flowchart 600 by using at least the registers 128 included in the NAND die 110.

Control starts at block 602 in which a non-volatile memory unit 110 (e.g., the NAND die 110) receives a request from a controller 106 to read encoded data stored in a non-volatile memory 114 of the non-volatile memory unit 110. The request from the controller 106 may include a memory address from which to perform the read from the NAND memory 114. In certain embodiments the non-volatile memory unit 110 is a NAND die 110. In other embodiments, the non-volatile memory unit 110 may be a system on a chip (SOC) that includes NAND memory and syndrome calculation logic. The controller 106 of the memory device 104 is external to the non-volatile memory unit 110. In certain embodiments, the non-volatile memory unit 110 may comprise a component that is different from a NAND die or a system on a chip (SOC).

From block 602 control proceeds to block 604 in which a determination is made by logic 116 (e.g., syndrome calculation logic 116) included in the non-volatile memory unit 110 as to whether the controller 106 is estimated to be able to successfully decode the encoded data more than a predetermined percentage of times.

In response to determining by logic 116 included in the non-volatile memory unit 110 that the controller is estimated to be able to successfully decode the encoded data more than a predetermined percentage of times ("Yes" branch 606), the encoded data is transferred (at block 608) from the non-volatile memory unit 110 to the controller 106 for decoding.

In response to determining by the logic 116 included in the non-volatile memory unit 110 that the controller 106 is estimated to be not able to successfully decode the encoded data more than the predetermined percentage of times ("No" branch 610), the non-volatile memory unit 110 avoids (at block 612) transferring the encoded data to the controller 106 for decoding.

Therefore, FIGS. 1-6 illustrate certain embodiments in which a NAND die judiciously responds to read requests from a controller, by determining whether the controller is likely to be able to decode the encoded data. If the controller is likely to be able to decode the encoded data, then the NAND die transfers the encoded data to the controller for decoding. In certain embodiments, the transfer of the encoded data to the controller may be over a data bus. If the controller is unlikely to be able to decode the encoded data, then the NAND die avoids transferring the encoded data to the controller for decoding. By restricting the transfer of encoded data from the NAND die to the controller only if the controller is likely to be able to decode the encoded data, the embodiments decrease the number of times encoded data is transferred from the NAND die to the controller and increase the quality of service for the SSD. Since the transfer of encoded data from the NAND die 110 to the controller 106 is relatively time consuming in comparison to the providing of an indication to the controller 106 that no encoded data is being transferred to the controller 106, by not transferring the encoded data when the controller 106 is unlikely to be able to decode the encoded data, the quality of service for the SSD 104 is increased.

The described operations may be implemented as a method, apparatus or computer program product using standard programming and/or engineering techniques to produce software, firmware, hardware, or any combination thereof. The described operations may be implemented as code maintained in a "computer readable storage medium", where a processor may read and execute the code from the computer storage readable medium. The computer readable storage medium includes at least one of electronic circuitry, storage materials, inorganic materials, organic materials, biological materials, a casing, a housing, a coating, and hardware. A computer readable storage medium may comprise, but is not limited to, a magnetic storage medium (e.g., hard disk drives, floppy disks, tape, etc.), optical storage (CD-ROMs, DVDs, optical disks, etc.), volatile and non-volatile memory devices (e.g., EEPROMs, ROMs, PROMs, RAMs, DRAMs, SRAMs, Flash Memory, firmware, programmable logic, etc.), Solid State Drives (SSD), etc. The code implementing the described operations may further be implemented in hardware logic implemented in a hardware device (e.g., an integrated circuit chip, Programmable Gate Array (PGA), Application Specific Integrated Circuit (ASIC), etc.). Still further, the code implementing the described operations may be implemented in "transmission signals", where transmission signals may propagate through space or through a transmission media, such as an optical fiber, copper wire, etc. The transmission signals in which the code or logic is encoded may further comprise a wireless signal, satellite transmission, radio waves, infrared signals, Bluetooth, etc. The program code embedded on a computer readable storage medium may be transmitted as transmission signals from a transmitting station or computer to a receiving station or computer. A computer readable storage medium is not comprised solely of transmission signals. Those skilled in the art will recognize that many modifications may be made to this configuration, and that the article of manufacture may comprise suitable information bearing medium known in the art.

Computer program code for carrying out operations for aspects of the certain embodiments may be written in any combination of one or more programming languages. Blocks of the flowchart and block diagrams may be implemented by computer program instructions.

Figure 7:
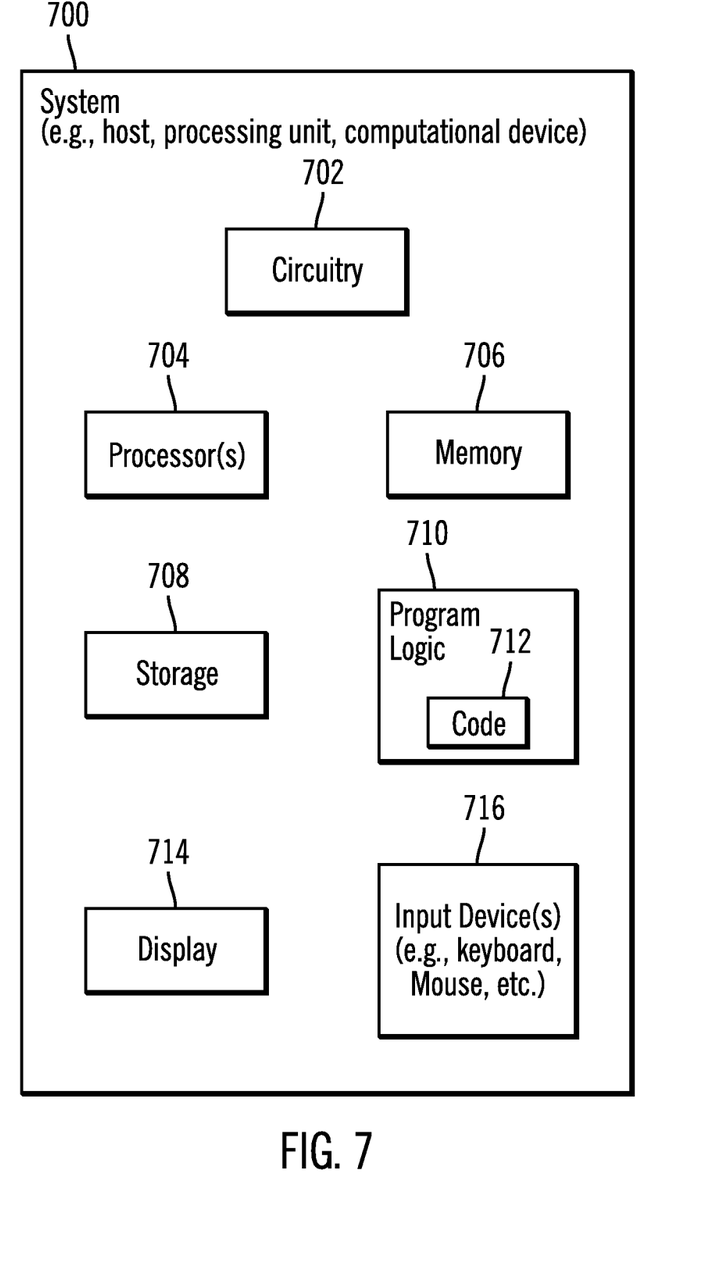
FIG. 7 illustrates a block diagram of a system, in accordance with certain embodiments.

FIG. 7 illustrates a block diagram of a system 700 that includes both the host 102 (the host 102 comprises at least a processor and may be referred to as a processing unit) and the solid state drive 104, in accordance with certain embodiments. For example, in certain embodiments the system 700 may be a computer (e.g., a laptop computer, a desktop computer, a tablet, a cell phone or any other suitable computational device) that has the host 102 and the solid state drive 104 both included in the system 700. For example, in certain embodiments the system 700 may be a laptop computer that includes the solid state drive 104. The system 700 may include a circuitry 702 that may in certain embodiments include at least a processor 704. The system 700 may also include a memory 706 (e.g., a volatile memory device), and storage 708. The storage 708 may include the solid state drive 104 or other drives or devices including a non-volatile memory device (e.g., EEPROM, ROM, PROM, flash, firmware, programmable logic, etc.). The storage 708 may also include a magnetic disk drive, an optical disk drive, a tape drive, etc. The storage 708 may comprise an internal storage device, an attached storage device and/or a network accessible storage device. The system 700 may include a program logic 710 including code 712 that may be loaded into the memory 706 and executed by the processor 704 or circuitry 702. In certain embodiments, the program logic 710 including code 712 may be stored in the storage 708. In certain other embodiments, the program logic 710 may be implemented in the circuitry 702. Therefore, while FIG. 7 shows the program logic 710 separately from the other elements, the program logic 710 may be implemented in the memory 706 and/or the circuitry 702. The system 700 may also include a display 714 (e.g., a liquid crystal display (LCD), a light emitting diode (LED) display, a cathode ray tube (CRT) display, a touchscreen display, or any other suitable display). The system 700 may also include one or more input devices 716, such as, a keyboard, a mouse, a joystick, a trackpad, or any other suitable input devices. Other components or devices beyond those shown in FIG. 7 may also be found in the system 700.

Certain embodiments may be directed to a method for deploying computing instruction by a person or automated processing integrating computer-readable code into a computing system, wherein the code in combination with the computing system is enabled to perform the operations of the described embodiments.

The terms "an embodiment", "embodiment", "embodiments", "the embodiment", "the embodiments", "one or more embodiments", "some embodiments", and "one embodiment" mean "one or more (but not all) embodiments" unless expressly specified otherwise.

The terms "including", "comprising", "having" and variations thereof mean "including but not limited to", unless expressly specified otherwise.

The enumerated listing of items does not imply that any or all of the items are mutually exclusive, unless expressly specified otherwise.

The terms "a", "an" and "the" mean "one or more", unless expressly specified otherwise.

Devices that are in communication with each other need not be in continuous communication with each other, unless expressly specified otherwise. In addition, devices that are in communication with each other may communicate directly or indirectly through one or more intermediaries.

A description of an embodiment with several components in communication with each other does not imply that all such components are required. On the contrary a variety of optional components are described to illustrate the wide variety of possible embodiments.

Further, although process steps, method steps, algorithms or the like may be described in a sequential order, such processes, methods and algorithms may be configured to work in alternate orders. In other words, any sequence or order of steps that may be described does not necessarily indicate a requirement that the steps be performed in that order. The steps of processes described herein may be performed in any order practical. Further, some steps may be performed simultaneously.

When a single device or article is described herein, it will be readily apparent that more than one device/article (whether or not they cooperate) may be used in place of a single device/article. Similarly, where more than one device or article is described herein (whether or not they cooperate), it will be readily apparent that a single device/article may be used in place of the more than one device or article or a different number of devices/articles may be used instead of the shown number of devices or programs. The functionality and/or the features of a device may be alternatively embodied by one or more other devices which are not explicitly described as having such functionality/features. Thus, other embodiments need not include the device itself.

At least certain operations that may have been illustrated in the figures show certain events occurring in a certain order. In alternative embodiments, certain operations may be performed in a different order, modified or removed. Moreover, steps may be added to the above described logic and still conform to the described embodiments. Further, operations described herein may occur sequentially or certain operations may be processed in parallel. Yet further, operations may be performed by a single processing unit or by distributed processing units.

The foregoing description of various embodiments has been presented for the purposes of illustration and description. It is not intended to be exhaustive or to be limited to the precise forms disclosed. Many modifications and variations are possible in light of the above teaching.

Examples

The following examples pertain to further embodiments.

Example 1 is a method for data transfer in which a non-volatile memory unit receives a request from a controller to read encoded data stored in a non-volatile memory of the non-volatile memory unit. In response to determining by logic included in the non-volatile memory unit that the controller is estimated to be able to successfully decode the encoded data more than a predetermined percentage of times, the encoded data is transferred from the non-volatile memory unit to the controller.

In example 2 the subject matter of example 1 may include that the non-volatile memory unit is a non-volatile memory die, the method further comprising: in response to determining by the logic included in the non-volatile memory die that the controller is estimated to be not able to successfully decode the encoded data more than the predetermined percentage of times, avoiding transferring the encoded data to the controller.

In example 3, the subject matter of claim 2 may include that the encoded data is low density parity check (LDPC) encoded data.

In example 4, the subject matter of claim 3 may include that determining by the logic included in the non-volatile memory die whether the controller is estimated to be able to successfully decode the LDPC encoded data more than the predetermined percentage of times comprises: calculating, by the logic, a syndrome of the LDPC encoded data; and determining whether a syndrome weight determined while calculating the syndrome is greater than a predetermined threshold.

In example 5, the subject matter of claim 4 may include that determining by the logic included in the non-volatile memory die whether the controller is estimated to be able to successfully decode the LDPC encoded data more than the predetermined percentage of times further comprises: in response to determining that the syndrome weight is greater than the predetermined threshold, determining that the controller is estimated to be not able to successfully decode the LDPC encoded data more than the predetermined percentage of times; and in response to determining that the syndrome weight is not greater than the predetermined threshold, determining that the controller is estimated to be able to successfully decode the LDPC encoded data more than the predetermined percentage of times.

In example 6, the subject matter of claim 2 may include that the non-volatile memory die and the controller are included in a solid state drive (SSD), wherein the controller includes a decoder that is configured to execute on the encoded data to perform operations for decoding the encoded data.

In example 7, the subject matter of claim 2 may include that the encoded data is LDPC encoded data, and wherein the logic included in the non-volatile memory die determines whether the controller is estimated to be able to successfully decode the encoded data more than the predetermined percentage of times by comparing a syndrome weight of the LDPC encoded data to a predetermined threshold.

In example 8, the subject matter of claim 2 may include that the predetermined threshold is programmed based on performance requirements of a solid state drive (SSD) that includes the controller and the non-volatile memory die.

Example 9 is a non-volatile memory device for data transfer, the non-volatile memory device comprising: a controller; and a non-volatile memory unit coupled to the controller, wherein the non-volatile memory unit is operable to: receive a request from the controller to read encoded data stored in a non-volatile memory of the non-volatile memory unit; and in response to a determination by logic included in the non-volatile memory unit that the controller is estimated to be able to successfully decode the encoded data more than a predetermined percentage of times, transfer the encoded data from the non-volatile memory unit to the controller.

In example 10 the subject matter of claim 9 may include that the non-volatile memory unit is a non-volatile memory die, wherein the non-volatile memory die is further operable to: in response to a determination by the logic included in the non-volatile memory die that the controller is estimated to be not able to successfully decode the encoded data more than the predetermined percentage of times, avoid transferring of the encoded data to the controller.

In example 11 the subject matter of claim 10 may include that the encoded data is low density parity check (LDPC) encoded data.

In example 12 the subject matter of claim 11 may include that determination by the logic included in the non-volatile memory die whether the controller is estimated to be able to successfully decode the LDPC encoded data more than the predetermined percentage of times comprises: calculate, by the logic, a syndrome of the LDPC encoded data; and determine whether a syndrome weight determined while calculating the syndrome is greater than a predetermined threshold.

In example 13 the subject matter of claim 12 may include that determination by the logic included in the non-volatile memory die whether the controller is estimated to be able to successfully decode the LDPC encoded data more than the predetermined percentage of times further comprises: in response to a determination that the syndrome weight is greater than the predetermined threshold, determine that the controller is estimated to be not able to successfully decode the LDPC encoded data more than the predetermined percentage of times; and in response to a determination that the syndrome weight is not greater than the predetermined threshold, determine that the controller is estimated to be able to successfully decode the LDPC encoded data more than the predetermined percentage of times.

In example 14 the subject matter of claim 10 may include that the controller includes a decoder that is configurable to execute on the encoded data to perform operations for decoding the encoded data.

In example 15 the subject matter of claim 10 may include that the encoded data is LDPC encoded data, wherein the logic included in the non-volatile memory die is configurable to determine whether the controller is estimated to be able to successfully decode the encoded data more than the predetermined percentage of times by comparison of a syndrome weight of the LDPC encoded data to a predetermined threshold.

In example 16 the subject matter of claim 15 may include that the predetermined threshold is configurable to be programmable based on performance requirements of the non-volatile memory device.

Example 17 is a non-volatile memory unit for data transfer coupled to a controller, the non-volatile memory unit comprising: a non-volatile memory; and logic coupled to the non-volatile memory, wherein the logic is operable to: receive a request from the controller to read encoded data stored in the non-volatile memory of the non-volatile memory unit; and in response to a determination by logic included in the non-volatile memory unit that the controller is estimated to be able to successfully decode the encoded data more than a predetermined percentage of times, transfer the encoded data from the non-volatile memory unit to the controller.

In example 18 the subject matter of claim 17 may include that the non-volatile memory unit is a non-volatile memory die, wherein the logic is further operable to: in response to a determination by the logic included in the non-volatile memory die that the controller is estimated to be not able to successfully decode the encoded data more than the predetermined percentage of times, avoid transferring of the encoded data to the controller.

In example 19 the subject matter of claim 18 may include that the encoded data is low density parity check (LDPC) encoded data.

In example 20 the subject matter of claim 19 may include that determination by the logic included in the non-volatile memory die whether the controller is estimated to be able to successfully decode the LDPC encoded data more than the predetermined percentage of times comprises: calculate, by the logic, a syndrome of the LDPC encoded data; and determine whether a syndrome weight determined while calculating the syndrome is greater than a predetermined threshold.

In example 21 the subject matter of claim 20 may include that determination by the logic included in the non-volatile memory die whether the controller is estimated to be able to successfully decode the LDPC encoded data more than the predetermined percentage of times further comprises: in response to a determination that the syndrome weight is greater than the predetermined threshold, determine that the controller is estimated to be not able to successfully decode the LDPC encoded data more than the predetermined percentage of times; and in response to a determination that the syndrome weight is not greater than the predetermined threshold, determine that the controller is estimated to be able to successfully decode the LDPC encoded data more than the predetermined percentage of times.

Example 22 is a system for data transfer, the system comprising: a processing unit; a display; and a non-volatile memory device comprising a controller and a non-volatile memory unit, wherein the non-volatile memory unit is operable to: receive a request from the controller to read encoded data stored in a non-volatile memory of the non-volatile memory unit; and in response to a determination by logic included in the non-volatile memory unit that the controller is estimated to be able to successfully decode the encoded data more than a predetermined percentage of times, transfer the encoded data from the non-volatile memory unit to the controller.

In example 23 the subject matter of claim 22 may include that the non-volatile memory unit is a non-volatile memory die, wherein the non-volatile memory die is further operable to: in response to a determination by the logic included in the non-volatile memory die that the controller is estimated to be not able to successfully decode the encoded data more than the predetermined percentage of times, avoid transferring of the encoded data to the controller.

In example 24 the subject matter of claim 23 may include that the encoded data is low density parity check (LDPC) encoded data.

In example 25 the subject matter of claim 24 may include that determination by the logic included in the non-volatile memory die whether the controller is estimated to be able to successfully decode the LDPC encoded data more than the predetermined percentage of times comprises: calculate, by the logic, a syndrome of the LDPC encoded data; and determine whether a syndrome weight determined while calculating the syndrome is greater than a predetermined threshold.

In example 26 the subject matter of claim 25 may include that determination by the logic included in the non-volatile memory die whether the controller is estimated to be able to successfully decode the LDPC encoded data more than the predetermined percentage of times further comprises: in response to a determination that the syndrome weight is greater than the predetermined threshold, determine that the controller is estimated to be not able to successfully decode the LDPC encoded data more than the predetermined percentage of times; and in response to a determination that the syndrome weight is not greater than the predetermined threshold, determine that the controller is estimated to be able to successfully decode the LDPC encoded data more than the predetermined percentage of times.

Example 27 is a system for data transfer comprising: means for receiving, by a non-volatile memory unit, a request from a controller to read encoded data stored in a non-volatile memory of the non-volatile memory unit; and means for performing in response to determining by logic included in the non-volatile memory unit that the controller is estimated to be able to successfully decode the encoded data more than a predetermined percentage of times, transferring the encoded data from the non-volatile memory unit to the controller for decoding.

All optional features of any of the systems and/or apparatus described above may also be implemented with respect to the method or process described above, and specifics in the examples may be used anywhere in one or more embodiments. Additionally, all optional features of the method or process described above may also be implemented with respect to any of the system and/or apparatus described above, and specifics in the examples may be used anywhere in one or more embodiments.

What is claimed is:

1. A method, comprising:
   receiving, by a non-volatile memory unit, a request from a controller to read encoded data stored in a non-volatile memory of the non-volatile memory unit;
   in response to determining by logic included in the non-volatile memory unit that the controller is estimated to be able to successfully decode the encoded data more than a predetermined percentage of times, transferring the encoded data from the non-volatile memory unit to the controller for decoding; and
   in response to determining by the logic included in the non-volatile memory unit that the controller is estimated to be not able to successfully decode the encoded data more than the predetermined percentage of times, avoiding transferring the encoded data to the controller.

2. The method of claim 1, wherein the non-volatile memory unit is a non-volatile memory die.

3. The method of claim 2, wherein the encoded data is low density parity check (LDPC) encoded data.

4. The method of claim 3, wherein determining by the logic included in the non-volatile memory die whether the controller is estimated to be able to successfully decode the LDPC encoded data more than the predetermined percentage of times comprises:
   calculating, by the logic, a syndrome of the LDPC encoded data; and
   determining whether a syndrome weight determined while calculating the syndrome is greater than a predetermined threshold.

5. The method of claim 4, wherein determining by the logic included in the non-volatile memory die whether the controller is estimated to be able to successfully decode the LDPC encoded data more than the predetermined percentage of times further comprises:
   in response to determining that the syndrome weight is greater than the predetermined threshold, determining that the controller is estimated to be not able to successfully decode the LDPC encoded data more than the predetermined percentage of times; and
   in response to determining that the syndrome weight is not greater than the predetermined threshold, determining that the controller is estimated to be able to successfully decode the LDPC encoded data more than the predetermined percentage of times.

6. The method of claim 2, wherein the non-volatile memory die and the controller are included in a solid state drive (SSD), and wherein the controller includes a decoder that is configured to execute on the encoded data to perform operations for decoding the encoded data.

7. The method of claim 2, wherein the encoded data is LDPC encoded data, and wherein the logic included in the non-volatile memory die determines whether the controller is estimated to be able to successfully decode the encoded data more than the predetermined percentage of times by comparing a syndrome weight of the LDPC encoded data to a predetermined threshold.

8. The method of claim 7, wherein the predetermined threshold is programmed based on performance requirements of a solid state drive (SSD) that includes the controller and the non-volatile memory die.

9. A non-volatile memory device, comprising:
   a controller; and
   a non-volatile memory unit coupled to the controller, wherein the non-volatile memory unit is operable to:
   receive a request from the controller to read encoded data stored in a non-volatile memory of the non-volatile memory unit;
   in response to a determination by logic included in the non-volatile memory unit that the controller is estimated to be able to successfully decode the encoded data more than a predetermined percentage of times, transfer the encoded data from the non-volatile memory unit to the controller; and
   in response to a determination by the logic included in the non-volatile memory unit that the controller is estimated to be not able to successfully decode the encoded data more than the predetermined percentage of times, avoid transferring of the encoded data to the controller.

10. The non-volatile memory device of claim 9, wherein the non-volatile memory unit is a non-volatile memory die.

11. The non-volatile memory device of claim 10, wherein the encoded data is low density parity check (LDPC) encoded data.

12. The non-volatile memory device of claim 11, wherein determination by the logic included in the non-volatile memory die whether the controller is estimated to be able to successfully decode the LDPC encoded data more than the predetermined percentage of times comprises:
   calculate, by the logic, a syndrome of the LDPC encoded data; and
   determine whether a syndrome weight determined while calculating the syndrome is greater than a predetermined threshold.

13. The non-volatile memory device of claim 12, wherein determination by the logic included in the non-volatile memory die whether the controller is estimated to be able to successfully decode the LDPC encoded data more than the predetermined percentage of times further comprises:
   in response to a determination that the syndrome weight is greater than the predetermined threshold, determine that the controller is estimated to be not able to successfully decode the LDPC encoded data more than the predetermined percentage of times; and
   in response to a determination that the syndrome weight is not greater than the predetermined threshold, determine that the controller is estimated to be able to successfully decode the LDPC encoded data more than the predetermined percentage of times.

14. The non-volatile memory device of claim 10, wherein the controller includes a decoder that is configurable to execute on the encoded data to perform operations for decoding the encoded data.

15. The non-volatile memory device of claim 10, wherein the encoded data is LDPC encoded data, and wherein the logic included in the non-volatile memory die is configurable to determine whether the controller is estimated to be able to successfully decode the encoded data more than the predetermined percentage of times by comparison of a syndrome weight of the LDPC encoded data to a predetermined threshold.

16. The non-volatile memory device of claim 15, wherein the predetermined threshold is configurable to be programmable based on performance requirements of the non-volatile memory device.

17. A non-volatile memory unit coupled to a controller, the non-volatile memory unit comprising:
   a non-volatile memory; and
   logic coupled to the non-volatile memory, wherein the logic is operable to:
      receive a request from the controller to read encoded data stored in the non-volatile memory of the non-volatile memory unit;
         in response to a determination by logic included in the non-volatile memory unit that the controller is estimated to be able to successfully decode the encoded data more than a predetermined percentage of times, transfer the encoded data from the non-volatile memory unit to the controller; and
         in response to a determination by the logic included in the non-volatile memory unit that the controller is estimated to be not able to successfully decode the encoded data more than the predetermined percentage of times, avoid transferring of the encoded data to the controller.

18. The non-volatile memory unit of claim 17, wherein the non-volatile memory unit is a non-volatile memory die.

19. A system, comprising:
   a processing unit;
   a display; and
   a non-volatile memory device comprising a controller and a non-volatile memory unit, wherein the non-volatile memory unit is operable to:
   receive a request from the controller to read encoded data stored in a non-volatile memory of the non-volatile memory unit;
   in response to a determination by logic included in the non-volatile memory unit that the controller is estimated to be able to successfully decode the encoded data more than a predetermined percentage of times, transfer the encoded data from the non-volatile memory unit to the controller; and
   in response to a determination by the logic included in the non-volatile memory unit that the controller is estimated to be not able to successfully decode the encoded data more than the predetermined percentage of times, avoid transferring of the encoded data to the controller.

20. The system of claim 19, wherein the non-volatile memory unit is a non-volatile memory die.

* * * * *